(12) United States Patent
Wang et al.

(10) Patent No.: US 10,755,966 B2
(45) Date of Patent: Aug. 25, 2020

(54) MANUFACTURING METHOD OF SMOOTHING A SEMICONDUCTOR SURFACE

(71) Applicant: GlobalWafers Co., Ltd., Hsinchu (TW)

(72) Inventors: Gang Wang, Grover, MO (US);
Charles R. Lottes, Ballwin, MO (US);
Sasha Kweskin, St. Louis, MO (US)

(73) Assignee: GlobaWafers Co., Ltd., Hsinchu (TW)

( * ) Notice: Subject to any disclaimer, the term of this patent is extended or adjusted under 35 U.S.C. 154(b) by 0 days.

(21) Appl. No.: 16/505,950

(22) Filed: Jul. 9, 2019

(65) Prior Publication Data

US 2019/0333804 A1 Oct. 31, 2019

Related U.S. Application Data

(62) Division of application No. 15/775,924, filed as application No. PCT/US2016/062050 on Nov. 15, 2016, now Pat. No. 10,529,616.

(Continued)

(51) Int. Cl.
*H01L 21/00* (2006.01)
*H01L 21/762* (2006.01)
(Continued)

(52) U.S. Cl.
CPC .. *H01L 21/76251* (2013.01); *H01L 21/02052* (2013.01); *H01L 21/0262* (2013.01);
(Continued)

(58) Field of Classification Search
None
See application file for complete search history.

(56) References Cited

U.S. PATENT DOCUMENTS 3,909,304 A 9/1975 Cho
4,501,060 A 2/1985 Frye et al.
(Continued)

FOREIGN PATENT DOCUMENTS

EP 0939430 A2 1/1999
EP 1865551 A2 12/2007
(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.
(Continued)

*Primary Examiner* — Evren Seven
(74) *Attorney, Agent, or Firm* — Armstrong Teasdale LLP

(57) ABSTRACT

A method is provided for preparing semiconductor structure, e.g., a semiconductor on insulator structure, comprising a device layer having a smooth surface. The method provided involves smoothing a semiconductor substrate surface by making use of stress enhanced surface diffusion at elevated temperatures. The purpose of this method is to reach atomic scale surface smoothness (for example, smoothness in the range of between 1.0 and 1.5 angstroms as measured according to root mean square over a 30 um×30 um AFM measurement), which is required in advanced (sub 28 nm) CMOS device fabrication.

24 Claims, 5 Drawing Sheets

Related U.S. Application Data

(60) Provisional application No. 62/257,764, filed on Nov. 20, 2015.

(51) Int. Cl.
*H01L 21/324* (2006.01)
*H01L 21/02* (2006.01)
*H01L 27/146* (2006.01)

(52) U.S. Cl.
CPC .. *H01L 21/02532* (2013.01); *H01L 21/02581* (2013.01); *H01L 21/3247* (2013.01); *H01L 21/76254* (2013.01); *H01L 27/14632* (2013.01)

(56) References Cited

U.S. PATENT DOCUMENTS

| | | | |
|---|---|---|---|
| 4,755,865 A | 7/1988 | Wilson et al. | |
| 4,968,384 A | 11/1990 | Asano | |
| 5,189,500 A | 2/1993 | Kusunoki | |
| 5,461,250 A | 10/1995 | Burghartz et al. | |
| 5,773,355 A | 6/1998 | Shunsuke et al. | |
| 6,043,138 A | 3/2000 | Ibok | |
| 6,204,205 B1 | 3/2001 | Yu et al. | |
| 6,271,144 B1 | 8/2001 | Monget et al. | |
| 6,326,285 B1 | 12/2001 | Behfar et al. | |
| 6,373,113 B1 | 4/2002 | Gardner et al. | |
| 6,448,152 B1* | 9/2002 | Henley | H01L 21/76254 257/E21.568 |
| 6,479,166 B1 | 11/2002 | Heuer et al. | |
| 6,562,127 B1 | 5/2003 | Kud et al. | |
| 6,562,703 B1 | 5/2003 | Maa et al. | |
| 6,624,047 B1 | 9/2003 | Sakaguchi et al. | |
| 7,018,882 B2 | 3/2006 | Tweet et al. | |
| 7,459,374 B2 | 12/2008 | Aulnetta et al. | |
| 7,868,419 B1 | 1/2011 | Kerr et al. | |
| 7,879,699 B2 | 2/2011 | Schulze et al. | |
| 7,915,716 B2 | 3/2011 | Pisigan et al. | |
| 8,058,137 B1 | 11/2011 | Or-Bach et al. | |
| 8,076,750 B1 | 12/2011 | Kerr et al. | |
| 8,466,036 B2 | 6/2013 | Brindle et al. | |
| 8,481,405 B2 | 7/2013 | Arriagada et al. | |
| 8,796,116 B2 | 8/2014 | Grabbe et al. | |
| 8,846,493 B2 | 9/2014 | Libbert et al. | |
| 8,859,393 B2 | 10/2014 | Ries et al. | |
| 9,202,711 B2 | 12/2015 | Liu et al. | |
| 9,425,081 B2 | 8/2016 | Ben Mohamed et al. | |
| 2002/0090758 A1 | 7/2002 | Henley et al. | |
| 2004/0003769 A1 | 1/2004 | Tamatasuka et al. | |
| 2004/0005740 A1 | 1/2004 | Lochtefeld et al. | |
| 2004/0031979 A1 | 2/2004 | Lochtefeld et al. | |
| 2004/0108537 A1 | 6/2004 | Tiwari | |
| 2004/0213907 A1 | 10/2004 | Todd et al. | |
| 2005/0026432 A1* | 2/2005 | Atwater, Jr. | H01L 21/187 438/689 |
| 2005/0153524 A1 | 7/2005 | Maa et al. | |
| 2005/0167002 A1 | 8/2005 | Ghyselen et al. | |
| 2006/0030124 A1 | 2/2006 | Maa et al. | |
| 2006/0033110 A1 | 2/2006 | Alam et al. | |
| 2006/0046431 A1 | 3/2006 | Blietz et al. | |
| 2006/0063353 A1 | 3/2006 | Akatsu | |
| 2006/0226482 A1 | 10/2006 | Suvorov | |
| 2007/0032040 A1 | 2/2007 | Lederer | |
| 2007/0037323 A1 | 2/2007 | Henley et al. | |
| 2007/0054466 A1 | 3/2007 | Hebras | |
| 2007/0200144 A1 | 8/2007 | Aspar et al. | |
| 2007/0284660 A1 | 12/2007 | Deguet et al. | |
| 2008/0171443 A1 | 7/2008 | Hebras | |
| 2008/0299744 A1 | 12/2008 | Yamazaki et al. | |
| 2009/0004833 A1 | 1/2009 | Suzuki et al. | |
| 2009/0014828 A1 | 1/2009 | Mizushima et al. | |
| 2009/0111236 A1 | 1/2009 | Kimura et al. | |
| 2009/0092810 A1 | 4/2009 | Lee et al. | |
| 2009/0117716 A1 | 5/2009 | Shimomura et al. | |
| 2009/0278233 A1 | 11/2009 | Pinnington et al. | |
| 2009/0309190 A1* | 12/2009 | Nevin | H01L 21/26506 257/616 |
| 2009/0321829 A1 | 12/2009 | Nguyen et al. | |
| 2011/0174362 A1 | 7/2011 | Tanner et al. | |
| 2011/0298083 A1 | 12/2011 | Yoneda | |
| 2012/0091587 A1 | 4/2012 | Or-Bach et al. | |
| 2012/0161310 A1 | 6/2012 | Brindle et al. | |
| 2012/0238070 A1 | 9/2012 | Libbert et al. | |
| 2012/0267681 A1 | 10/2012 | Nemoto et al. | |
| 2013/0092320 A1 | 4/2013 | Argoud et al. | |
| 2013/0120951 A1 | 5/2013 | Zuo et al. | |
| 2013/0122672 A1 | 5/2013 | Or-Bach et al. | |
| 2013/0168835 A1 | 7/2013 | Botula et al. | |
| 2013/0193445 A1 | 8/2013 | Dennard et al. | |
| 2013/0294038 A1 | 11/2013 | Landru et al. | |
| 2013/0344680 A1 | 12/2013 | Arriagada et al. | |
| 2014/0042598 A1 | 2/2014 | Kitada et al. | |
| 2014/0070215 A1 | 3/2014 | Bedell et al. | |
| 2014/0084290 A1 | 3/2014 | Allibert et al. | |
| 2014/0120654 A1 | 5/2014 | Fujii et al. | |
| 2014/0124902 A1 | 5/2014 | Botula et al. | |
| 2014/0273405 A1 | 9/2014 | Liu et al. | |
| 2015/0004778 A1 | 1/2015 | Botula et al. | |
| 2015/0104926 A1 | 4/2015 | Libbert et al. | |
| 2015/0112308 A1 | 4/2015 | Ishida | |
| 2015/0115480 A1 | 4/2015 | Peidous et al. | |
| 2016/0108551 A1 | 4/2016 | Basak et al. | |
| 2017/0033002 A1 | 2/2017 | Meguro et al. | |
| 2017/0200648 A1 | 7/2017 | Lee et al. | |
| 2017/0345663 A1 | 11/2017 | Ishizuka et al. | |
| 2019/0074215 A1 | 3/2019 | Ecarnot et al. | |

FOREIGN PATENT DOCUMENTS

| | | | |
|---|---|---|---|
| EP | 2426701 A1 | 7/2012 | |
| EP | 2503592 A1 | 9/2012 | |
| EP | 2579303 A1 | 10/2013 | |
| JP | H01315144 A | 12/1989 | |
| JP | 2012253364 A | 12/2012 | |
| WO | 2009120407 A2 | 10/2009 | |
| WO | 2012127006 A1 | 9/2012 | |
| WO | 2015112308 A1 | 7/2015 | |
| WO | 2015119742 A1 | 8/2015 | |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Jounral of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546, vol. 72, No. 20.

(56) References Cited

OTHER PUBLICATIONS

Lu, Hongqiang et al., Characterization of methyl-doped silicon oxide film deposited using Flowfil(TM) chemical vapor deposition technology, Journal of Vacuum Science and Technology, Part B, May 2002, pp. 828-833, vol. 20, No. 3, Melville, New York.

Tong, Q. Y. et al., Semiconductor wafer bonding: recent developments, Materials Chemistry and Physics, Mar. 1994, pp. 101/127, vol. 37, No. 2, Elsevier Sequoia.

Porrini, M. et al., Growth of Large Diameter High purity Silicon Single Crystals With The MCZ Method for Power Devices Applications, MADEP, Symposium on Materials and Devices for Powerelectronics, EPE Europen Conference on Power Electronics and Applications, Sep. 2, 1991, pp. 90-93.

\* cited by examiner

MANUFACTURING METHOD OF SMOOTHING A SEMICONDUCTOR SURFACE

CROSS-REFERENCE TO RELATED APPLICATION

This application is a divisional application of U.S. application Ser. No. 15/775,924, filed May 14, 2018, the entire disclosure of which is hereby incorporated by reference as if set forth in its entirety. U.S. application Ser. No. 15/775,924 is a National Stage application of International Application No. PCT/US2016/062050, filed on Nov. 15, 2016, the entire disclosure of which is hereby incorporated by reference as if set forth in its entirety. International Application No. PCT/US2016/062050 claims priority to U.S. Provisional Patent Application No. 62/257,764 filed on 20 Nov. 2015, the entire disclosure of which is hereby incorporated by reference in its entirety.

FIELD OF THE INVENTION

The present invention generally relates to the field of semiconductor wafer manufacture. More specifically, the present invention relates to a method for producing a semiconductor-on-insulator (e.g., silicon-on-insulator) structure, and more particularly to a method for producing a semiconductor-on-insulator (e.g., silicon-on-insulator) structure having a smooth exposed device layer surface.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group IV elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

The bonded structure may thereafter undergo a finishing process step, typically an epitaxial smoothing step to achieve a targeted device layer thickness and a targeted device layer surface roughness target. The cleaving process to prepare a semiconductor-on-insulator structure (e.g., a silicon-on-insulator structure) may cause high surface roughness on the exposed surface of the device layer prior to epitaxial smoothing. Due to the limited thermal budget of the epitaxial smoothing process, the surface roughness may be reduced to as low as about >1.7 angstrom (calculated using the root mean square over a 30 um×30 um surface area). Achieving further reduced surface roughness has proven to be challenging. The fundamental barrier for the surface roughness reduction is the compressive stress in the device layer as a result of the thermal mismatch between the buried dielectric layer (e.g., buried oxide, such as $SiO_2$) and the device layer (e.g., single crystal silicon device layer). Another factor that contributes to the compressive stress in the device layer is the ion implant (typically, Hydrogen and/or He) induced stress. The compressive stress leads to corrugation of the exposed surface of the device layer, resulting in long wavelength (um scale) surface roughness.

SUMMARY OF THE INVENTION

Among the provisions of the present invention may be noted a method of preparing a multilayer structure, the method comprising: depositing a layer of silicon dioxide on a back surface of a single crystal semiconductor handle wafer, wherein the single crystal semiconductor handle wafer comprises two major, parallel surfaces, one of which is the back surface of the single crystal semiconductor handle wafer and the other of which is a front surface of the single crystal semiconductor handle wafer, a circumferential edge joining the front surface and the back surface of the single crystal semiconductor handle wafer, a central axis perpendicular to the front surface and the back surface of the single crystal semiconductor handle wafer, and a bulk region between the front and back surfaces of the semiconductor handle wafer; bonding the front surface of the single crystal semiconductor handle wafer to a front surface of a single crystal semiconductor donor wafer to thereby form a bonded structure, wherein the single crystal semiconductor donor wafer comprises two major, generally parallel surfaces, one of which is the front surface of the single crystal semiconductor donor wafer and the other of which is a back surface of the single crystal semiconductor donor wafer, a circumferential edge joining the front and back surfaces of the single crystal semiconductor donor wafer, and a bulk region between the front and back surfaces of the single crystal semiconductor donor wafer, and further wherein the front surface of the single crystal semiconductor donor wafer comprises a dielectric layer and the bulk region comprises a cleave plane; mechanically cleaving the bonded structure at the cleave plane of the single crystal semiconductor donor wafer to thereby prepare a cleaved structure comprising the layer of silicon dioxide in contact with the back surface of the single crystal semiconductor handle wafer, the single crystal semiconductor handle wafer, the dielectric layer in contact with the front surface of the single crystal semiconductor handle wafer, and a single crystal semiconductor device layer, wherein the single crystal semiconductor device layer comprises an exposed surface; and smoothing the exposed surface of the single crystal semiconductor device layer to a root mean square surface roughness over a 30 micrometer by 30 micrometer surface region of less than about 2 angstroms to thereby prepare the multilayer structure.

The present invention is further directed to a method of preparing a multilayer structure, the method comprising: depositing a layer of silicon nitride on a back surface of a single crystal semiconductor handle wafer, wherein the single crystal semiconductor handle wafer comprises two major, parallel surfaces, one of which is the back surface of the single crystal semiconductor handle wafer and the other of which is a front surface of the single crystal semiconductor handle wafer, a circumferential edge joining the front surface and the back surface of the single crystal semiconductor handle wafer, a central axis perpendicular to the front surface and the back surface of the single crystal semiconductor handle wafer, and a bulk region between the front and back surfaces of the semiconductor handle wafer; bonding the front surface of the single crystal semiconductor handle wafer to a front surface of a single crystal semiconductor donor wafer to thereby form a bonded structure, wherein the single crystal semiconductor donor wafer comprises two major, generally parallel surfaces, one of which is the front surface of the single crystal semiconductor donor wafer and the other of which is a back surface of the single crystal semiconductor donor wafer, a circumferential edge joining the front and back surfaces of the single crystal semiconductor donor wafer, and a bulk region between the front and back surfaces of the single crystal semiconductor donor wafer, and further wherein the front surface of the single crystal semiconductor donor wafer comprises a dielectric layer and the bulk region comprises a cleave plane; mechanically cleaving the bonded structure at the cleave plane of the single crystal semiconductor donor wafer to thereby prepare a cleaved structure comprising the layer of silicon nitride in contact with the back surface of the single crystal semiconductor handle wafer, the single crystal semiconductor handle wafer, the dielectric layer in contact with the front surface of the single crystal semiconductor handle wafer, and a single crystal semiconductor device layer, wherein the single crystal semiconductor device layer comprises an exposed surface; and smoothing the exposed surface of the single crystal semiconductor device layer to a root mean square surface roughness over a 30 micrometer by 30 micrometer surface region of less than about 2 angstroms to thereby prepare the multilayer structure.

The present invention is still further directed to a method of preparing a multilayer structure, the method comprising: depositing a layer of polycrystalline silicon carbide on a back surface of a single crystal semiconductor handle wafer, wherein the single crystal semiconductor handle wafer comprises two major, parallel surfaces, one of which is the back surface of the single crystal semiconductor handle wafer and the other of which is a front surface of the single crystal semiconductor handle wafer, a circumferential edge joining the front surface and the back surface of the single crystal semiconductor handle wafer, a central axis perpendicular to the front surface and the back surface of the single crystal semiconductor handle wafer, and a bulk region between the front and back surfaces of the semiconductor handle wafer; bonding the front surface of the single crystal semiconductor handle wafer to a front surface of a single crystal semiconductor donor wafer to thereby form a bonded structure, wherein the single crystal semiconductor donor wafer comprises two major, generally parallel surfaces, one of which is the front surface of the single crystal semiconductor donor wafer and the other of which is a back surface of the single crystal semiconductor donor wafer, a circumferential edge joining the front and back surfaces of the single crystal semiconductor donor wafer, and a bulk region between the front and back surfaces of the single crystal semiconductor donor wafer, and further wherein the front surface of the single crystal semiconductor donor wafer comprises a dielectric layer and the bulk region comprises a cleave plane; mechanically cleaving the bonded structure at the cleave plane of the single crystal semiconductor donor wafer to thereby prepare a cleaved structure comprising the layer of polycrystalline silicon carbide or the layer of carbon-doped silicon in contact with the back surface of the single crystal semiconductor handle wafer, the single crystal semiconductor handle wafer, the dielectric layer in contact with the front surface of the single crystal semiconductor handle wafer, and a single crystal semiconductor device layer, wherein the single crystal semiconductor device layer comprises an exposed surface; and smoothing the exposed surface of the single crystal semiconductor device layer to a root mean square surface roughness over a 30 micrometer by 30 micrometer surface region of less than about 2 angstroms to thereby prepare the multilayer structure.

The present invention is still further directed to a method of preparing a multilayer structure, the method comprising: depositing a layer of boron-doped silicon on a back surface of a single crystal semiconductor handle wafer, wherein the single crystal semiconductor handle wafer comprises two major, parallel surfaces, one of which is the back surface of the single crystal semiconductor handle wafer and the other of which is a front surface of the single crystal semiconductor handle wafer, a circumferential edge joining the front surface and the back surface of the single crystal semiconductor handle wafer, a central axis perpendicular to the front surface and the back surface of the single crystal semiconductor handle wafer, and a bulk region between the front and back surfaces of the semiconductor handle wafer; bonding the front surface of the single crystal semiconductor handle wafer to a front surface of a single crystal semiconductor donor wafer to thereby form a bonded structure, wherein the single crystal semiconductor donor wafer comprises two major, generally parallel surfaces, one of which is the front surface of the single crystal semiconductor donor wafer and the other of which is a back surface of the single crystal semiconductor donor wafer, a circumferential edge joining the front and back surfaces of the single crystal semiconductor donor wafer, and a bulk region between the front and back surfaces of the single crystal semiconductor donor wafer, and further wherein the front surface of the single crystal semiconductor donor wafer comprises a dielectric layer and the bulk region comprises a cleave plane; mechanically cleaving the bonded structure at the cleave plane of the single crystal semiconductor donor wafer to thereby prepare a cleaved structure comprising the layer of boron-doped silicon in contact with the back surface of the single crystal semiconductor handle wafer, the single crystal semiconductor handle wafer, the dielectric layer in contact with the front surface of the single crystal semiconductor handle wafer, and a single crystal semiconductor device layer, wherein the single crystal semiconductor device layer comprises an exposed surface; and smoothing the exposed surface of the single crystal semiconductor device layer to a root mean square surface roughness over a 30 micrometer by 30 micrometer surface region of less than about 2 angstroms to thereby prepare the multilayer structure.

Other objects and features will be in part apparent and in part pointed out hereinafter.

DETAILED DESCRIPTION OF THE EMBODIMENT(S) OF THE INVENTION

According to the present invention, a method is provided for preparing a semiconductor-on-insulator structure (e.g., a silicon-on-insulator structure) comprising a device layer of acceptable smoothness for a wide variety of applications, including CMOS device fabrication. According to the method of the present invention, a stress layer is deposited on the backside of the handle wafer so that at the temperature of a smoothing process a tensile stress is developed in the stress layer. The tensile stress on the backside is translated to the device layer, typically a single crystal semiconductor layer, such as single crystal silicon. The backside stress layer under tensile stress establishes a chemical gradient from the peak to valley, which drives surface diffusion of atoms from the peak to valley. The chemical potential gradient increases with surface curvature, which makes the wavy surface thermodynamically unstable. As a result, an atomically long-range flat surface can be obtained.

I. Semiconductor Handle Wafer

Figure 1A:
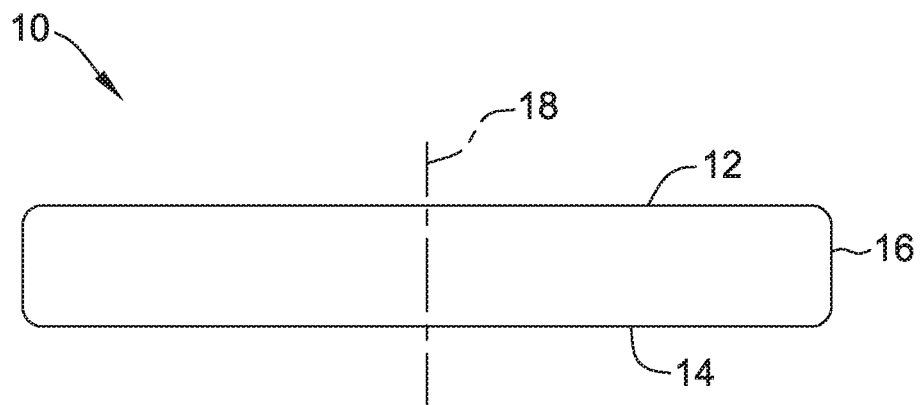
FIGS. 1A through 1F depict the process flow according to an exemplary, non-limiting embodiment of the invention.

The substrates for use in the present invention include a semiconductor handle wafer, e.g., a single crystal semiconductor handle wafer. FIGS. 1A through 1F depict the process flow according to some embodiments of the present invention. With reference to FIG. 1A, an exemplary, non-limiting single crystal semiconductor handle wafer 10 is depicted. In general, the single crystal semiconductor handle wafer 10 comprises two major, generally parallel surfaces 12, 14. One of the parallel surfaces is a front surface 12 of the single crystal semiconductor handle wafer 10, and the other parallel surface is a back surface 14 of the single crystal semiconductor handle wafer 10. The single crystal semiconductor handle wafer 10 comprises a circumferential edge 16 joining the front and back surfaces 12, 14. The single crystal semiconductor handle wafer 10 comprise a central axis 18 perpendicular to the two major, generally parallel surfaces 12, 14 and also perpendicular to a central plane defined by the points midway between the front and back surfaces 12, 14. Since semiconductor wafers, e.g., silicon wafers, typically have some total thickness variation (TTV), warp, and bow, the midpoint between every point on the front surface 12 and every point on the back surface 14 may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface 12 and the back surface 14 of the single crystal semiconductor handle wafer 10 may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle wafer 10, e.g., a single crystal silicon handle wafer, refers to the major surface of the substrate that becomes an interior surface of the bonded structure. Accordingly, a "back surface" of a single crystal semiconductor handle wafer 10, e.g., a handle wafer, refers to the major surface that becomes an exterior surface of the bonded structure. Similarly, a "front surface" of a single crystal semiconductor donor substrate, e.g., a single crystal silicon donor wafer, refers to the major surface of the single crystal semiconductor donor substrate that becomes an interior surface of the bonded structure, and a "back surface" of a single crystal semiconductor donor substrate, e.g., a single crystal silicon donor wafer, refers to the major surface that becomes an exterior surface of the bonded structure. Upon completion of conventional bonding and wafer thinning steps, the single crystal semiconductor donor substrate forms the semiconductor device layer of the semiconductor-on-insulator (e.g., silicon-on-insulator) composite structure.

In preferred embodiments, the single crystal semiconductor handle wafer 10 comprises a material selected from the group consisting of silicon, silicon carbide, silicon germanium, gallium arsenide, gallium nitride, indium phosphide, indium gallium arsenide, germanium, and combinations thereof. The single crystal semiconductor handle wafer 10 of the present invention typically has a nominal diameter of at least about 150 mm, at least about 200 mm, at least about 300 mm, at least about 450 mm, or more. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers. In some embodiments, the wafer thickness may be about 775 micrometers.

In particularly preferred embodiments, the single crystal semiconductor handle wafer 10 comprises a single crystal silicon wafer, which has been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, at least about 450 mm, or more. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some embodiments, the single crystal semiconductor handle wafer 10 comprises interstitial oxygen in concentrations that are generally achieved by the Czochralski-growth method. In some embodiments, the single crystal semiconductor handle wafer 10 comprises oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon wafer comprises oxygen in a concentration of no greater than about 10 PPMA. Interstitial oxygen may be measured according to SEMI MF 1188-1105.

In general, there are no constraints on the resistivity of the handle wafers of the SOI substrate. The single crystal semiconductor handle wafer 10 may have any resistivity obtainable by the Czochralski or float zone methods. Accordingly, the resistivity of the single crystal semiconductor handle wafer 10 is based on the requirements of the end use/application of the structure of the present invention. The resistivity may therefore vary from milliohm or less to megaohm or more. In some embodiments, the single crystal semiconductor handle wafer 10 comprises a p-type or an n-type dopant. Suitable dopants include boron (p type), gallium (p type), phosphorus (n type), antimony (n type), and arsenic (n type). The dopant concentration is selected based on the desired resistivity of the handle wafer. In some embodiments, the single crystal semiconductor handle wafer comprises a p-type dopant. In some embodiments, the single crystal semiconductor handle wafer is a single crystal silicon wafer comprising a p-type dopant, such as boron.

In some embodiments, the single crystal semiconductor handle wafer 10 has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle wafer 10 has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), phosphorus (n type), antimony (n type), and arsenic (n type).

In some embodiments, the single crystal semiconductor handle wafer 10 has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer 10 has a minimum bulk resistivity of at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. In some embodiments, the single crystal semiconductor handle wafer 10 may comprise a p type dopant, such as boron, gallium, aluminum, or indium. In some embodiments, the single crystal semiconductor handle wafer 10 may comprise a n type dopant, such as phosphorus, antimony, or arsenic. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

The single crystal semiconductor handle wafer 10 may comprise single crystal silicon. The single crystal semiconductor handle wafer 10 may have any of (100), (110), or (111) crystal orientation, and the choice of crystal orientation may be dictated by the end use of the structure.

II. Deposition of Stress Layer

Figure 1B:
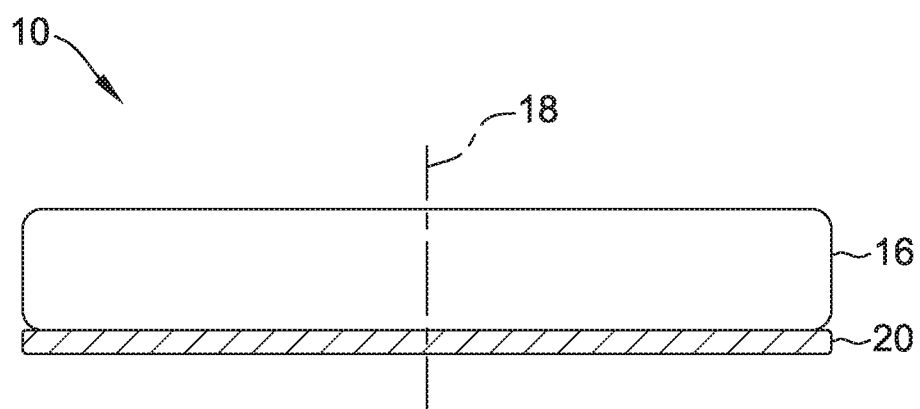

In some embodiments of the method of the present invention, and with reference to FIGS. 1A and 1B, a stress layer 20 is deposited on the back surface 14 of the single crystal semiconductor handle wafer 10. The stress layer 20 can be any material capable of introducing stable tensile stress in the handle wafer 10 and does not cause unwanted contamination (e.g. organics, metals). In some embodiments, the stress layer 20 comprises silicon dioxide, $SiO_2$. In some embodiments, the stress layer 20 comprises silicon nitride, $Si_3N_4$. In some embodiments, the stress layer 20 comprises silicon oxynitride, which may have the composition $SiO_yN_x$, wherein x has a value between 0 and 3, such as between 0.1 and 3, or between 0.1 and 2.9, and y has a value from 0 to 2, such as between 0.1 and 2, or between 0.1 and 1.9. In some embodiments, the stress layer 20 comprises polycrystalline silicon carbide, SiC. In some embodiments, the stress layer 20 comprises carbon-doped silicon, C-doped Si. In some embodiments, the stress layer 20 comprises boron doped silicon, B-doped Si.

The tensile stress in the deposited stress layer 20 is required to achieve between about 60 micrometer and about 180 micrometer 3-point wafer bow. Depending on the film stress, the required stress layer 20 thickness is given in Table 1. This requirement applies to any stress layer 20. The stress is a function of deposition method, process conditions (e.g., plasma power for PECVD, deposition temperature for PECVD and LPCVD), and the precursors used.

TABLE 1

| Film thickness (um) | Minimum Film stress (MPa) | Maximum Film stress (Mpa) |
| --- | --- | --- |
| 0.1 | 960 | 2880 |
| 0.2 | 480 | 1440 |
| 0.3 | 320 | 960 |
| 0.5 | 190 | 570 |

In general, the stress layer 20 may be deposited by metalorganic chemical vapor deposition (MOCVD), physical vapor deposition (PVD), chemical vapor deposition (CVD), plasma enhanced chemical vapor deposition (PECVD), low pressure chemical vapor deposition (LP-CVD), or molecular beam epitaxy (MBE). In some embodiments, the stress layer 20 may be deposited by chemical vapor deposition (CVD), plasma enhanced chemical vapor deposition (PECVD), or low pressure chemical vapor deposition (LPCVD). A CVD reactor comprises a chamber comprising reactor walls, liner, a susceptor, gas injection units, and temperature control units. The parts of the reactor are made of materials resistant to and non-reactive with the precursor materials. To prevent overheating, cooling water may be flowing through the channels within the components of the reactor. A substrate sits On a susceptor which is at a controlled temperature. The susceptor is made from a material resistant to the precursors, such as ceramic, SiC, or graphite. For growing nitrides and related materials, a special coating on the graphite susceptor may be used to prevent corrosion by ammonia ($NH_3$) gas. Reactive gas is introduced by an inlet that controls the ratio of precursor reactants. The growth temperature may be between about 200° C. and about 1200° C., between about 200° C. and about 1150° C., between about 200° C. and about 900° C., between about 200° C. and about 500° C., or between about 900° C. and about 1200° C., depending upon the composition of the stress layer. The stress layer may be formed under reduced pressure, such as between about $10^{-11}$ Torr (about $1\times10^{-9}$ Pa) to about 760 Torr (about 101 kPa), or between about 1 Torr (about 0.13 kPa) and about 400 Torr (about 53.3 kPa), preferably between about 10 Torr (about 1.33 kPa) and about 80 Torr (about 10.67 kPa).

In some embodiments, the stress layer 20 comprises silicon dioxide ($SiO_2$). In some embodiments, the stress layer 20 comprising silicon dioxide ($SiO_2$) may be deposited on the back surface 14 of the single crystal semiconductor handle wafer 10 by physical vapor deposition (PVD), chemical vapor deposition (CVD), plasma enhanced chemical vapor deposition (PECVD), or low pressure chemical vapor deposition (LPCVD). Silicon precursors for LPCVD or PECVD include tetraorthosilicate (TEOS), methyl silane, silicon tetrahydride (silane), trisilane, disilane, pentasilane, neopentasilane, tetrasilane, dichlorosilane ($SiH_2Cl_2$), silicon tetrachloride ($SiCl_4$), among others. Oxygen gas or ozone gas are suitable sources of oxygen for the growth of a silicon dioxide stress layer. The growth temperature may be between about 20° C. and about 1200° C., such as between about 200° C. and about 1200° C., or between about 200° C. and about 700° C., or between about 200° C. and about 500° C. The stress layer may be formed under reduced pressure, such as between about $10^{-11}$ Torr (about $1\times10^{-9}$ Pa) to about 760 Torr (about 101 kPa), or between about 1 Torr (about 0.13 kPa) and about 400 Torr (about 53.3 kPa), preferably between about 10 Torr (about 1.33 kPa) and about 80 Torr (about 10.67 kPa). In some embodiments, the stress layer 20 comprising silicon dioxide deposited on a back surface 14 of the single crystal semiconductor handle wafer 10 has a thickness between about 1000 angstroms and about 20,000 angstroms, as measured along the central axis 18 of the single crystal semiconductor handle wafer 10, such as between about 1000 angstroms and about 5000 angstroms, as measured along the central axis 18 of the single crystal semiconductor handle wafer 10.

In some embodiments, the stress layer 20 comprises silicon nitride ($Si_3N_4$). The stress layer 20 comprising silicon nitride may be deposited on the back surface 14 of the single crystal semiconductor handle wafer 10 by physical vapor deposition (PVD), chemical vapor deposition (CVD), plasma enhanced chemical vapor deposition (PECVD), or low pressure chemical vapor deposition (LPCVD). Silicon precursors for LPCVD or PECVD include methyl silane, silicon tetrahydride (silane), trisilane, disilane, pentasilane, neopentasilane, tetrasilane, dichlorosilane (SiH$_2$Cl$_2$), silicon tetrachloride (SiCl$_4$), among others. Nitrogen precursors include Ammonium, phenyl hydrazine, dimethyl hydrazine, tertiary butyl amine, and ammonia. The growth temperature may be between about 200° C. and about 1200° C., such as between about 200° C. and about 900° C. The stress layer may be formed under reduced pressure, such as between about 10$^{-11}$ Torr (about 1×10$^{-9}$ Pa) to about 760 Torr (about 101 kPa), or between about 1 Torr (about 0.13 kPa) and about 400 Torr (about 53.3 kPa), preferably between about 10 Torr (about 1.33 kPa) and about 80 Torr (about 10.67 kPa). In some embodiments, the stress layer 20 comprising silicon nitride deposited on the back surface 14 of the single crystal semiconductor handle wafer 10 has a thickness between about 500 angstroms and about 20,000 angstroms, as measured along the central axis 18 of the single crystal semiconductor handle wafer 10, such as between about 1000 angstroms and about 5000 angstroms, as measured along the central axis 18 of the single crystal semiconductor handle wafer 10.

In some embodiments, the stress layer 20 comprises silicon oxynitride, which may have the composition SiO$_y$N$_x$, wherein x has a value between 0 and 3, such as between 0.1 and 3, or between 0.1 and 2.9, and y has a value from 0 to 2, such as between 0.1 and 2, or between 0.1 and 1.9. Silicon oxynitride may be prepared by combining precursors for silicon, oxygen, and nitrogen, as described above with regard to the preparation of the silicon oxide and silicon nitride layers. In some embodiments, the stress layer 20 comprising silicon oxynitride deposited on the back surface 14 of the single crystal semiconductor handle wafer 10 has a thickness between about 500 angstroms and about 20,000 angstroms, as measured along the central axis 18 of the single crystal semiconductor handle wafer 10, such as between about 1000 angstroms and about 5000 angstroms, as measured along the central axis 18 of the single crystal semiconductor handle wafer 10.

In some embodiments, the stress layer 20 comprises polycrystalline silicon carbide or carbon-doped silicon. The stress layer 20 comprising polycrystalline silicon carbide or carbon-doped silicon may be deposited on the back surface 14 of the single crystal semiconductor handle wafer 10 by physical vapor deposition (PVD), chemical vapor deposition (CVD), plasma enhanced chemical vapor deposition (PECVD), or low pressure chemical vapor deposition (LPCVD). Silicon precursors for LPCVD or PECVD include methyl silane, silicon tetrahydride (silane), trisilane, disilane, pentasilane, neopentasilane, tetrasilane, dichlorosilane (SiH$_2$Cl$_2$), silicon tetrachloride (SiCl$_4$), among others. Suitable carbon precursors for CVD or PECVD include methylsilane, methane, ethane, ethylene, among others. For LPCVD deposition, methylsilane is a particularly preferred precursor since it provides both carbon and silicon. For PECVD deposition, the preferred precursors include silane and methane. In some embodiments, the polycrystalline silicon carbide layer comprises a carbon concentration of between about 35% and about 65% on an atomic basis, such as between about 40% and about 60% on an atomic basis, or about 50% on an atomic basis. In some embodiments, the carbon-doped amorphous silicon layer comprises a carbon concentration of at least about 1% on an atomic basis, such as between about 1% and about 50%, or between about 5% and about 50%. The growth temperature may be between about 200° C. and about 1200° C., such as between about 200° C. and about 900° C. The stress layer may be formed under reduced pressure, such as between about 10$^{-11}$ Torr (about 1×10$^{-9}$ Pa) to about 760 Torr (about 101 kPa), or between about 1 Torr (about 0.13 kPa) and about 400 Torr (about 53.3 kPa), preferably between about 10 Torr (about 1.33 kPa) and about 80 Torr (about 10.67 kPa). In some embodiments, the stress layer 20 comprising polycrystalline silicon carbide deposited on the back surface 14 of the single crystal semiconductor handle wafer 10 has a thickness between about 500 angstroms and about 50,000 angstroms, as measured along the central axis 18 of the single crystal semiconductor handle wafer 10, such as between about 500 angstroms and about 20,000 angstroms, as measured along the central axis 18 of the single crystal semiconductor handle wafer 10, such as between about 500 angstroms and about 5,000 angstroms, as measured along the central axis 18 of the single crystal semiconductor handle wafer 10.

In some embodiments, the stress layer 20 comprises boron-doped silicon. The stress layer 20 comprising boron-doped silicon may be deposited on the back surface 14 of the single crystal semiconductor handle wafer 10 by physical vapor deposition (PVD), chemical vapor deposition (CVD), plasma enhanced chemical vapor deposition (PECVD), or low pressure chemical vapor deposition (LPCVD). Silicon precursors for LPCVD or PECVD include methyl silane, silicon tetrahydride (silane), trisilane, disilane, pentasilane, neopentasilane, tetrasilane, dichlorosilane (SiH$_2$Cl$_2$), silicon tetrachloride (SiCl$_4$), among others. Boron precursors include diborane, boronchloride, 1,3,5-tri(N-methyl)borazine. The growth temperature may be between about 200° C. and about 1200° C., such as between about 200° C. and about 1150° C. In some embodiments, the stress layer 20 comprising boron-doped silicon deposited on the back surface 14 of the single crystal semiconductor handle wafer 10 comprises a boron dopant concentration between about 1×10$^{17}$ atoms/cm$^3$ and about 1×10$^{22}$ atoms/cm$^3$, such as between about 1×10$^{18}$ atoms/cm$^3$ and about 1×10$^{21}$ atoms/cm$^3$. The stress layer may be formed under reduced pressure, such as between about 10$^{-11}$ Torr (about 1×10$^{-9}$ Pa) to about 760 Torr (about 101 kPa), or between about 1 Torr (about 0.13 kPa) and about 400 Torr (about 53.3 kPa), preferably between about 10 Torr (about 1.33 kPa) and about 80 Torr (about 10.67 kPa). In some embodiments, the stress layer 20 comprising boron-doped silicon deposited on the back surface 14 of the single crystal semiconductor handle wafer 10 has a thickness between about 5000 angstroms and about 50,000 angstroms, as measured along the central axis 18 of the single crystal semiconductor handle wafer 10, such as between about 1000 angstroms and about 20,000 angstroms, as measured along the central axis 18 of the single crystal semiconductor handle wafer 10.

III. Wafer Bonding and Cleaving

Figure 1C:
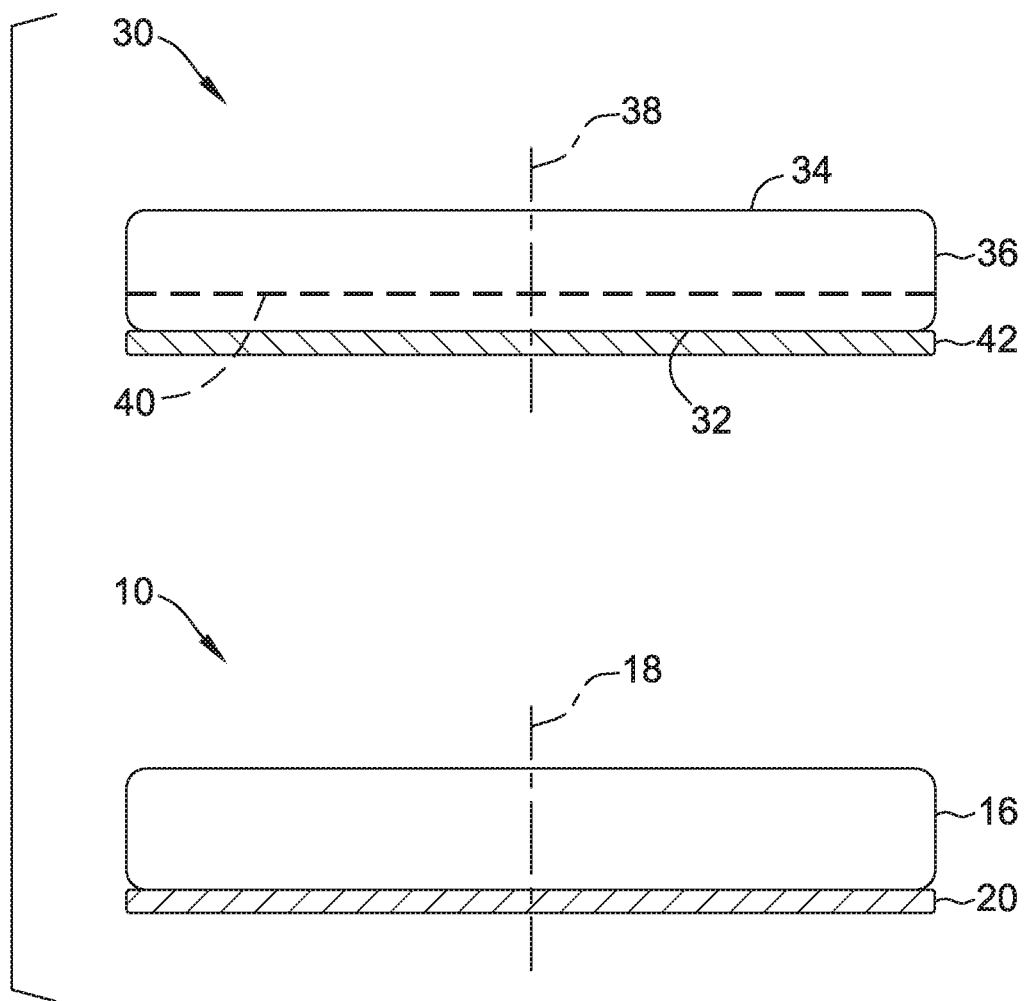

According to the method of the present invention and with reference to FIGS. 1B and 1C, the single crystal semiconductor handle wafer 10 comprising the stress layer 20 is next bonded to a single crystal semiconductor donor wafer 30. In general, the single crystal semiconductor donor wafer 30 comprises two major, generally parallel surfaces 32, 34. One of the parallel surfaces is a front surface 32 of the single crystal semiconductor donor wafer 30, and the other parallel surface is a back surface 34 of the single crystal semiconductor donor wafer 30. The single crystal semiconductor donor wafer 30 comprises a circumferential edge 36 joining the front and back surfaces 32, 34. The single crystal semiconductor donor wafer 30 comprises a central axis 38 perpendicular to the two major, generally parallel surfaces 32, 34 and also perpendicular to a central plane defined by the points midway between the front and back surfaces 32, 34. Since semiconductor wafers, e.g., silicon wafers, typically have some total thickness variation (TTV), warp, and bow, the midpoint between every point on the front surface 32 and every point on the back surface 34 may not precisely fall within a plane. As a practical matter, however, the TTV, warp, and bow are typically so slight that to a close approximation the midpoints can be said to fall within an imaginary central plane which is approximately equidistant between the front and back surfaces.

In preferred embodiments, the single crystal semiconductor donor wafer 30 comprises a material selected from the group consisting of silicon, silicon carbide, silicon germanium, gallium arsenide, gallium nitride, indium phosphide, indium gallium arsenide, germanium, and combinations thereof. The single crystal semiconductor donor wafer 30 of the present invention typically has a nominal diameter of at least about 150 mm, at least about 200 mm, at least about 300 mm, at least about 450 mm, or more. Wafer thicknesses may vary from about 250 micrometers to about 1500 micrometers, suitably within the range of about 500 micrometers to about 1000 micrometers. In particularly preferred embodiments, the single crystal semiconductor donor wafer 30 comprises a single crystal silicon wafer, which has been sliced from a single crystal ingot grown in accordance with conventional Czochralski crystal growing methods or float zone growing methods.

The single crystal semiconductor donor wafer 30 was subjected to standard process steps including oxidation, implant, and post implant cleaning. Accordingly, the single crystal semiconductor donor wafer 30 additionally comprises a cleave plane 40 and a dieletric layer 42 in contact with the front surface 32 of the single crystal semiconductor donor wafer 30. Suitable dielectric layers may comprise a material selected from among silicon dioxide, silicon nitride, silicon oxynitride, hafnium oxide, titanium oxide, zirconium oxide, lanthanum oxide, barium oxide, and a combination thereof. In some embodiments, the dielectric layer has a thickness of at least about 5 nanometer thick, at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers, or between about 100 nanometers and about 800 nanometers, such as about 600 nanometers.

In some embodiments, the dielectric layer comprises one or more insulating material selected from the group consisting of silicon dioxide, silicon nitride, silicon oxynitride, and any combination thereof. In some embodiments, the dielectric layer has a thickness of at least about 5 nanometer thick, at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers, or between about 100 nanometers and about 800 nanometers, such as about 600 nanometers.

In some embodiments, the dielectric layer comprises multiple layers of insulating material. The dielectric layer may comprise two insulating layers, three insulating layers, or more. Each insulating layer may comprise a material selected from among silicon dioxide, silicon oxynitride, silicon nitride, hafnium oxide, titanium oxide, zirconium oxide, lanthanum oxide, barium oxide, and any combination thereof. In some embodiments, each insulating layer may comprise a material selected from the group consisting of silicon dioxide, silicon nitride, siliconoxynitride, and any combination thereof. Each insulating layer may have a thickness of at least about 5 nanometer thick, at least about 10 nanometer thick, such as between about 10 nanometers and about 10,000 nanometers, between about 10 nanometers and about 5,000 nanometers, between 50 nanometers and about 400 nanometers, or between about 100 nanometers and about 400 nanometers, such as about 50 nanometers, 100 nanometers, or 200 nanometers, or between about 100 nanometers and about 800 nanometers, such as about 600 nanometers.

Figure 1D:
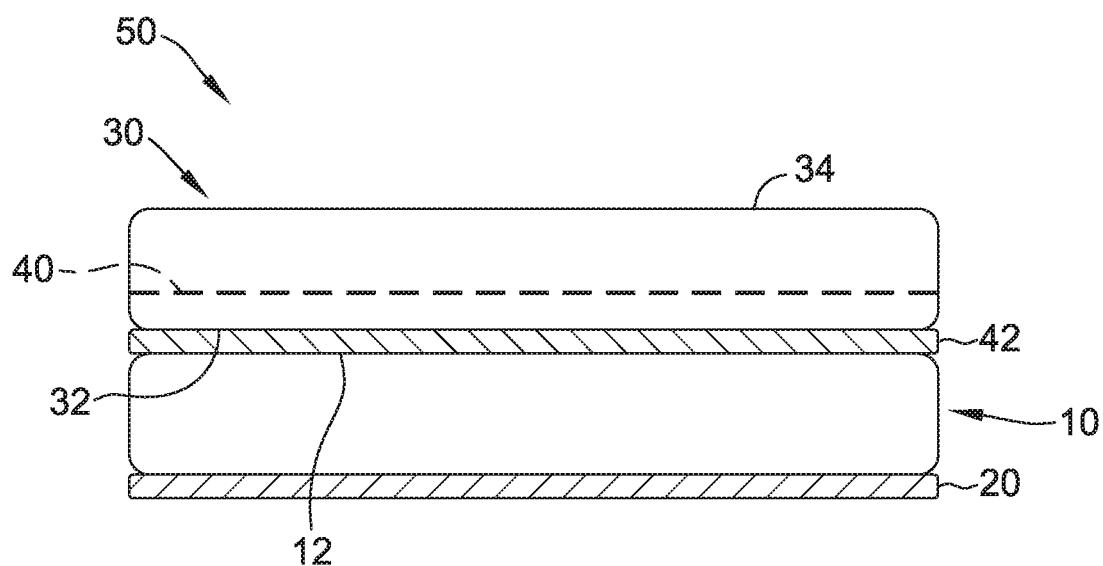

The cleave plane 40 of the single crystal semiconductor donor wafer 30 may be prepared by a conventional ion implantation method, followed by annealing of the bonded structure (see FIG. 1D). Ion implantation may be carried out in a commercially available instrument, such as an Applied Materials Quantum II, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/$cm^2$ to about $10^{17}$ ions/$cm^2$, such as from about $10^{14}$ ions/$cm^2$ to about $10^{17}$ ions/$cm^2$, such as from about $10^{15}$ ions/$cm^2$ to about $10^{16}$ ions/$cm^2$. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines amount of material transferred onto a handle wafer. In some embodiments it may be desirable to subject the single crystal semiconductor donor wafer 30 to a clean after the implant. In some preferred embodiments, the clean could include a Piranha clean followed by a DI water rinse and SC1/SC2 cleans.

In some embodiments, the ion-implanted and optionally cleaned single crystal semiconductor donor wafer 30 is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer 30 is exposed to this plasma for the desired time, which may range from about 1 second to about 120 seconds. Oxygen plasma surface oxidation is performed in order to render the front surface of the single crystal semiconductor donor wafer 30 hydrophilic and amenable to bonding to a single crystal semiconductor handle wafer 10 prepared according to the method described above.

According to the method of the present invention and with reference to FIG. 1D, the hydrophilic front surface layer 32 of the single crystal semiconductor donor wafer 30 comprising the dielectric layer 42 and the front surface 12 of the single crystal semiconductor handle wafer 10 are next brought into intimate contact to thereby form a bonded structure 50. Since the mechanical bond is relatively weak, the bonded structure 50 is further annealed to solidify the bond between the single crystal semiconductor donor wafer 30 and the single crystal semiconductor handle wafer 10. In some embodiments of the present invention, the bonded structure 50 is annealed at a temperature sufficient to form a thermally activated cleave plane 40 in the single crystal semiconductor donor wafer 30. An example of a suitable tool might be a simple Box furnace, such as a Blue M model. In some preferred embodiments, the bonded structure 50 is annealed at a temperature of from about 200° C. to about 1200° C., such as from about 225° C. to about 500° C., preferably about 300° C., or from about 500° C. to about 1200° C., such as from about 800° C. to about 1200° C. Thermal annealing may occur for a duration of from about 0.5 hours to about 10 hour, preferably a duration of about 2 hours. Thermal annealing within these temperatures ranges is sufficient to form a thermally activated cleave plane 40. After the thermal anneal to activate the cleave plane, the bonded structure 50 may be cleaved.

Figure 1E:
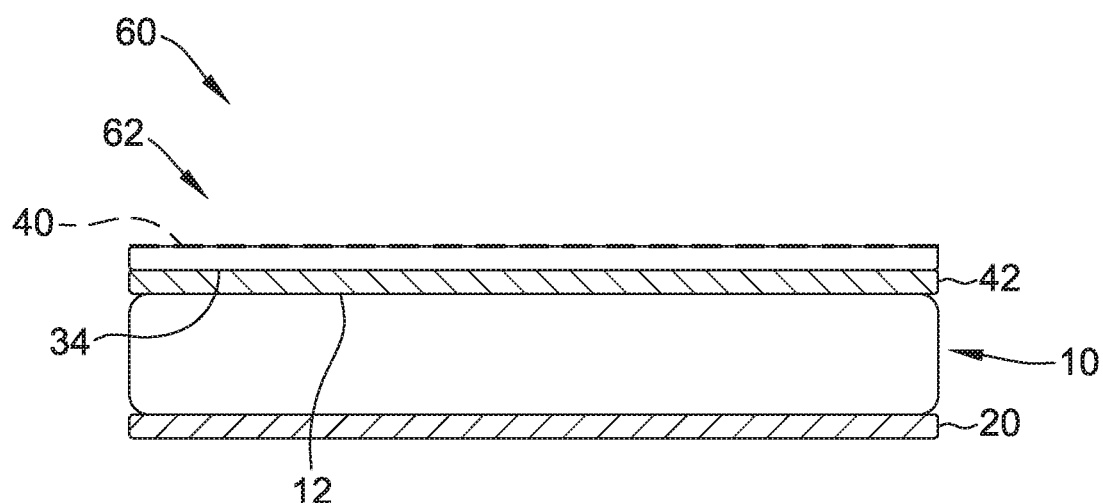

After the thermal anneal and with reference to FIGS. 1D and 1E, the bond between the single crystal semiconductor donor wafer 30 and the single crystal semiconductor handle wafer 10 is strong enough to initiate layer transfer via cleaving the bonded structure 50 at the cleave plane 40. Cleaving may occur according to techniques known in the art. In some embodiments, the bonded structure 50 may be placed in a conventional cleave station affixed to stationary suction cups on one side and affixed by additional suction cups on a hinged arm on the other side. A crack is initiated near the suction cup attachment and the movable arm pivots about the hinge cleaving the bonded structure 50 apart to thereby form a cleaved structure 60. Cleaving removes a portion of the single crystal semiconductor donor wafer 30, thereby leaving a single crystal semiconductor device layer 62, preferably a single crystal silicon device layer, on the semiconductor-on-insulator cleaved structure 60. In some embodiments, the single crystal semiconductor device layer 62 is between about 40 angstroms and about 1000 angstroms, such as between about 100 angstroms and about 500 angstroms.

After cleaving, the cleaved structure 60 is subjected to a high temperature anneal in order to further strengthen the bond between the transferred single crystal semiconductor device layer 62 and the single crystal semiconductor handle wafer 10. An example of a suitable tool might be a vertical furnace, such as an ASM A400. In some preferred embodiments, the cleaved structure 60 is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred single crystal semiconductor device layer 62 and the single crystal semiconductor handle wafer 10.

IV. Wafer Smoothing

Figure 1F:
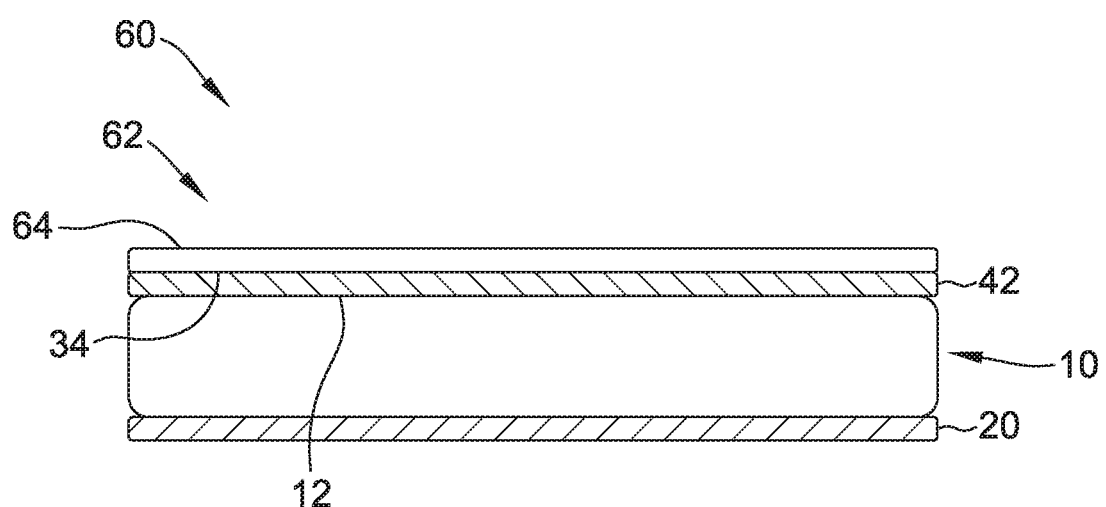

After cleaving and annealing, with reference to FIG. 1F, the cleaved structure 60 may be subjected to a cleaning process designed to remove thin thermal oxide and clean particulates from the exposed surface of the single crystal semiconductor device layer 62. If desired, the wafers can be cleaned, for example, in a standard SC1/SC2 solution.

In some embodiments, the exposed surface 64 of the single crystal semiconductor device layer 62 may be brought to a desired thickness and smoothness. In the fabrication of multilayer structures, e.g., semiconductor on insulator structures, regardless of the cleaving methods used, the surface roughness of the exposed surface 64 of the transferred single crystal semiconductor device layer 62 is relatively rough. Commonly, the surface roughness may be greater than 100 angstroms, as measured by a root mean square surface roughness over a 30 micrometer by 30 micrometer surface region. The surface roughness is generally measured by atomic force microscopy over the 30 micrometer by 30 micrometer surface region.

Approaches used to finish the rough surface include plasma etching, chemical mechanical polishing (CMP), high temperature anneal in inert or reducing ambient, and epitaxial smoothing.

Plasma etching takes place in low temperature regime (e.g., generally less than about 600° C.). In this temperature regime, the surface diffusivity of silicon atoms is low. Accordingly, plasma etching of a conventionally prepared structure may only achieve a root mean square roughness on the order of 10 angstroms. This method is not often used in CMOS SOI fabrication due to the high surface roughness.

Chemical mechanical polishing (CMP) may be able to smooth the exposed surface of the silicon device layer on the order of 1.0 to 1.5 angstroms as calculated by the root mean square method over a 30 um×30 um surface area. However, the drawback of CMP is that it is not able to achieve uniform etching, leading to thickness uniformity concern. The state of the art CMOS device technology requires tight single crystal semiconductor device layer 62 thickness uniformity (e.g., within the range of <10-20 angstroms), which is beyond the capability of typical CMP processes. CMP finishing can only be applied to semiconductor-on-insulator structure (e.g., a silicon-on-insulator structure) with relatively loose thickness uniformity requirements for the device layer.

High temperature anneal in inert (e.g., Ar, He) or reducing ambient (e.g., $H_2$) requires extensive thermal budget. Accordingly, the temperature may range from about 1000° C. to about 1200° C., and the duration may range from about 1 minute to about 6 hours, such as between about 2 hours and 6 hours. According to conventional techniques, wafer slip and silicon dewetting are common issues. Surface diffusion is enabled by the high temperature and long processing time. However, the long-range surface roughness is still constrained by the compressive stress in the single crystal semiconductor device layer 62 due to the mismatch of coefficient of thermal expansion between the single crystal semiconductor device layer 62 and the underlying dielectric, e.g., $SiO_2$, layer. Typical roughness is on the order of 2 angstroms as calculated by the root mean square method over a 30 um×30 um surface area. According to the present invention, at temperatures between about 1000° C. and about 1200° C., the mobility of Si atoms on the Si surface is high enough for effective surface diffusion. The driving force for the surface diffusion is the chemical gradient that is a function of the local surface curvature and stress. Tensile stress promotes surface diffusion from the peak to valley so that the surface becomes smooth. High temperature and tensile stress are the criteria for effective surface smoothing.

Epitaxial smoothing is a thermal process that employs an etching gas (such as $Cl_2$ or HCl) in combination with a carrier gas (typically $H_2$) in a horizontal flow single wafer epitaxial reactor to smooth the single crystal semiconductor device layer 62 surface at relatively high temperatures, such as between about 900° C. and about 1150° C., or between about 1000° C. and about 1100° C. The process duration is in the order of a few minutes, such as between about 1 minute and about 60 minutes. Because of the limited thermal budget, the surface roughness of the finished single crystal semiconductor device layer 62 is generally on the order of 2 angstroms to 4 angstroms as calculated by the root mean square method over a 30 um×30 um surface area. However, conventional epi smoothing is not able to reduce roughness from ~100 Å (root mean square method over a 30 um×30 um surface scan) down to between 1 and 1.5 angstroms as calculated by the root mean square method over a 30 um×30 um surface area. Again the roughness is limited by the compressive stress in the single crystal semiconductor device layer 62. According to the method of the present invention, the effect of tensile stress in the single crystal semiconductor device layer 62 on smoothing has to be realized at high temperature (e.g. 1000° C. and above). The fundamental mechanism is that tensile stress contributes to the chemical gradient on an undulated surface, which drives the diffusion of surface atoms moving from the peak to valley of a surface.

According to the method of the present invention, the exposed surface of the single crystal semiconductor device layer 62 may be subjected to a smoothing process, such as epitaxial smoothing and/or chemical mechanical polishing (CMP) to reduce the surface roughness, preferably to the level of $RMS_{2\times2\ um2}$ is less than about 2 angstroms, even more preferably less than about 1.5 angstroms, or even less than about 1.0 angstrom, such as between about 0.8 angstroms and about 1.2 angstroms, or between about 0.8 angstroms and about 1.0 angstroms. The root mean square is calculated according to the following equation:

$$R_q = \sqrt{\frac{1}{n}\sum_{i=1}^{n} y_i^2}$$

The roughness profile contains ordered, equally spaced points along the trace, and $y_i$ is the vertical distance from the mean line to the data point. Roughness is measured over a 30 micrometer by 30 micrometer surface area.

Optionally, the backside layer may be removed or may be left on the handle wafer, depending upon the requirements of the end use of the multilayer structure. Preferably, the backside layer is removed after smoothing the single crystal semiconductor device layer 62. Once the single crystal semiconductor device layer 62 is smoothed, removing the backside stress layer will not change the surface roughness. A silicon dioxide layer, for example, can be removed using plasma etching or wet etch (like HF solution with 5%-49% vol. concentration in a conventional wafer cleaning tool).

Having described the invention in detail, it will be apparent that modifications and variations are possible without departing from the scope of the invention defined in the appended claims.

EXAMPLES

The following non-limiting examples are provided to further illustrate the present invention.

Example 1

Stress layers comprising boron-doped silicon were deposited upon the back surfaces of single crystal silicon handle wafers. For each wafer, the thickness of the stress layer was 4 micrometers. A first wafer was deposited with a boron-doped silicon stress layer at a boron concentration at a concentration of $1\times10^{21}$ atoms/cm$^3$ ("High Stress Layer" or "High SL"). A second wafer was deposited with a boron-doped silicon stress layer at a boron concentration at a concentration of $1\times10^{18}$ atoms/cm$^3$ ("Low Stress Layer" or "Low SL"). A third wafer was deposited with a boron-doped silicon stress layer at a boron concentration at a concentration of $1\times10^{20}$ atoms/cm$^3$ ("Medium Stress Layer" or "Medium SL"). In this example, the handle wafers comprises 300 mm diameter P-single crystal silicon wafers. The thickness of the wafers was 775 micrometers, and each was boron doped to a concentration of $1.0\times10^{15}$ atoms/cm$^3$. The Boron doped epitaxial layers were deposited on the backside of the wafers using trichlorosilane (TCS) and Diborane as the Si and Boron precursors, respectively. An ASM E3200 epi reactor was used for the deposition of the boron-doped silicon backside layer with $H_2$ carrier gas at atmospheric pressure and at a temperature of 1100° C. The back side boron-doped silicon layer was deposited to a thickness of 4 micrometers.

Five silicon-on-insulator structures were prepared according to the SMART CUT® technique. After the layer transfer process, the silicon-on-insulator structures comprises the handle wafer with the boron-doped silicon backside layer, a silicon dioxide dielectric layer having a thickness of 250 angstroms, and a single crystal silicon device layer having a thickness of 500 angstroms. The exposed surface of the single crystal silicon device layer was smoothed by epitaxial smoothing in the same ASM E3200 epi reactor at a temperature of 1000° C. for 200 s with $H_2$ carrier gas and HCl and at a partial pressure of 2.8 Torr. Three SOI structures were prepared comprising the handle wafers comprising the High Stress Layer, the Medium Stress Layer, and the Low Stress Layer. Two more SOI structures were prepared comprising handle wafers having no stress layers. The control SOI sample did not receive epi smoothing process. The no stress layer sample was subjected to the same epi smoothing process as the structures comprising backside stress layer.

Figure 2:
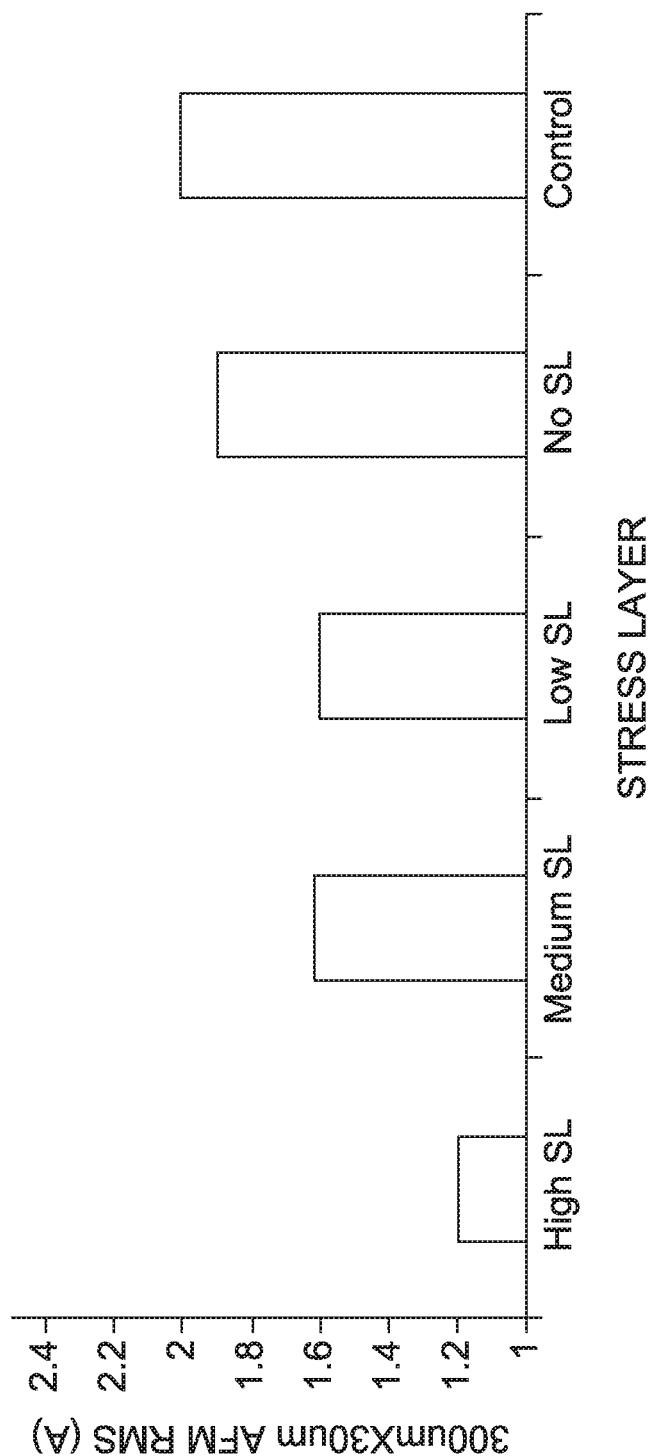
FIG. 2 is a graph depicting the smoothness achievable on the exposed surface of a device layer of several multilayer structures.

The surface roughness, as measured by the root mean square method over a 30 um×30 um surface area, are shown in FIG. 2. As shown in FIG. 2, the two SOI structures prepared without stress layer (labelled No SL and control) exhibited a smoothed exposed surface of the device layer of about 1.9 Angstroms or 2 angstroms. For the SOI structures prepared with a backside stress layer, the roughness of the exposed surface of the device layer decreased with increasing concentration of boron. The High SL structure had the best roughness at 1.2 angstroms, which is the smoothest surface achievable.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A method of preparing a multilayer structure, the method comprising:
   depositing a stress layer of silicon nitride on a back surface of a single crystal semiconductor handle wafer and depositing a layer of silicon nitride on a front surface of the single crystal semiconductor handle wafer simultaneously with deposition of the stress layer of silicon nitride on the back surface of the single crystal semiconductor handle wafer, wherein the single crystal semiconductor handle wafer comprises two major, parallel surfaces, one of which is the back surface of the single crystal semiconductor handle wafer and the other of which is a front surface of the single crystal semiconductor handle wafer, a circumferential edge joining the front surface and the back surface of the single crystal semiconductor handle wafer, a central axis perpendicular to the front surface and the back surface of the single crystal semiconductor handle wafer, and a bulk region between the front and back surfaces of the semiconductor handle wafer;

removing the layer of silicon nitride deposited on the front surface of the single crystal semiconductor handle wafer prior to a bonding step;

bonding the front surface of the single crystal semiconductor handle wafer to a front surface of a single crystal semiconductor donor wafer to thereby form a bonded structure, wherein the single crystal semiconductor donor wafer comprises two major, generally parallel surfaces, one of which is the front surface of the single crystal semiconductor donor wafer and the other of which is a back surface of the single crystal semiconductor donor wafer, a circumferential edge joining the front and back surfaces of the single crystal semiconductor donor wafer, and a bulk region between the front and back surfaces of the single crystal semiconductor donor wafer, and further wherein the front surface of the single crystal semiconductor donor wafer comprises a dielectric layer and the bulk region comprises a cleave plane, and further wherein the bonded structure comprises the stress layer of silicon nitride deposited on the back surface of the single crystal semiconductor handle wafer, the single crystal semiconductor handle wafer, the dielectric layer in contact with the front surface of the single crystal semiconductor handle wafer, and the single crystal semiconductor donor wafer;

mechanically cleaving the bonded structure at the cleave plane of the single crystal semiconductor donor wafer to thereby prepare a cleaved structure comprising the layer of silicon nitride in contact with the back surface of the single crystal semiconductor handle wafer, the single crystal semiconductor handle wafer, the dielectric layer in contact with the front surface of the single crystal semiconductor handle wafer , and a single crystal semiconductor device layer, wherein the single crystal semiconductor device layer comprises an exposed surface; and smoothing the exposed surface of the single crystal semiconductor device layer to a root mean square surface roughness over a 30 micrometer by 30 micrometer surface region of less than about 2 angstroms to thereby prepare the multilayer structure.

2. The method of claim 1 wherein the single crystal semiconductor handle wafer comprises a material selected from the group consisting of silicon, silicon carbide, silicon germanium, gallium arsenide, gallium nitride, indium phosphide, indium gallium arsenide, germanium, and combinations thereof.

3. The method of claim 1 wherein the single crystal semiconductor handle wafer comprises a single crystal silicon wafer sliced from a single crystal silicon ingot grown by the Czochralski method or the float zone method.

4. The method of claim 1 wherein the stress layer of silicon nitride deposited on the back surface of the single crystal semiconductor handle wafer has a thickness between about 500 angstroms and about 20,000 angstroms, as measured along the central axis of the single crystal semiconductor handle wafer.

5. The method of claim 1 wherein the stress layer of silicon nitride deposited on the back surface of the single crystal semiconductor handle wafer has a thickness between about 1000 angstroms and about 5000 angstroms, as measured along the central axis of the single crystal semiconductor handle wafer.

6. The method of claim 1 wherein the single crystal semiconductor device layer is between about 40 angstroms and about 1000 angstroms thick, as measured along the central axis of the single crystal semiconductor handle wafer.

7. The method of claim 1 wherein the single crystal semiconductor device layer comprises single crystal silicon.

8. The method of claim 1 wherein the exposed surface of the single crystal semiconductor device layer is smoothed to a root mean square surface roughness over a 30 micrometer by 30 micrometer surface region of less than about 1.5 angstroms.

9. The method of claim 1 wherein the exposed surface of the single crystal semiconductor device layer is smoothed to a root mean square surface roughness over a 30 micrometer by 30 micrometer surface region of less than about 1.0 angstroms.

10. The method of claim 1 wherein the exposed surface of the single crystal semiconductor device layer is smoothed to a root mean square surface roughness over a 30 micrometer by 30 micrometer surface region of between about 0.8 angstroms and about 1.2 angstroms.

11. The method of claim 1 wherein the exposed surface of the single crystal semiconductor device layer is smoothed to a root mean square surface roughness over a 30 micrometer by 30 micrometer surface region of between about 0.8 angstroms and about 1.0 angstroms.

12. The method of claim 1 wherein the exposed surface of the single crystal semiconductor device layer is smoothed by epitaxial smoothing.

13. A method of preparing a multilayer structure, the method comprising:
depositing a stress layer of silicon oxynitride on a back surface of a single crystal semiconductor handle wafer and depositing a layer of silicon oxynitride on a front surface of the single crystal semiconductor handle wafer simultaneously with deposition of the stress layer of silicon oxynitride on the back surface of the single crystal semiconductor handle wafer, wherein the single crystal semiconductor handle wafer comprises two major, parallel surfaces, one of which is the back surface of the single crystal semiconductor handle wafer and the other of which is a front surface of the single crystal semiconductor handle wafer, a circumferential edge joining the front surface and the back surface of the single crystal semiconductor handle wafer, a central axis perpendicular to the front surface and the back surface of the single crystal semiconductor handle wafer, and a bulk region between the front and back surfaces of the semiconductor handle wafer;

removing the layer of silicon oxynitride deposited on the front surface of the single crystal semiconductor handle wafer prior to a bonding step;

bonding the front surface of the single crystal semiconductor handle wafer to a front surface of a single crystal semiconductor donor wafer to thereby form a bonded structure, wherein the single crystal semiconductor donor wafer comprises two major, generally parallel surfaces, one of which is the front surface of the single crystal semiconductor donor wafer and the other of which is a back surface of the single crystal semiconductor donor wafer, a circumferential edge joining the front and back surfaces of the single crystal semiconductor donor wafer, and a bulk region between the front and back surfaces of the single crystal semiconductor donor wafer, and further wherein the front surface of the single crystal semiconductor donor wafer comprises a dielectric layer and the bulk region comprises a cleave plane, and further wherein the bonded structure comprises the stress layer of silicon oxynitride deposited on the back surface of the single crystal semiconductor handle wafer, the single crystal semiconductor handle wafer, the dielectric layer in contact with the front surface of the single crystal semiconductor handle wafer, and the single crystal semiconductor donor wafer;

mechanically cleaving the bonded structure at the cleave plane of the single crystal semiconductor donor wafer to thereby prepare a cleaved structure comprising the layer of silicon oxynitride in contact with the back surface of the single crystal semiconductor handle wafer, the single crystal semiconductor handle wafer, the dielectric layer in contact with the front surface of the single crystal semiconductor handle wafer , and a single crystal semiconductor device layer, wherein the single crystal semiconductor device layer comprises an exposed surface; and smoothing the exposed surface of the single crystal semiconductor device layer to a root mean square surface roughness over a 30 micrometer by 30 micrometer surface region of less than about 2 angstroms to thereby prepare the multilayer structure.

14. The method of claim 13 wherein the single crystal semiconductor handle wafer comprises a material selected from the group consisting of silicon, silicon carbide, silicon germanium, gallium arsenide, gallium nitride, indium phosphide, indium gallium arsenide, germanium, and combinations thereof.

15. The method of claim 13 wherein the single crystal semiconductor handle wafer comprises a single crystal silicon wafer sliced from a single crystal silicon ingot grown by the Czochralski method or the float zone method.

16. The method of claim 13 wherein the stress layer of silicon oxynitride deposited on the back surface of the single crystal semiconductor handle wafer has a thickness between about 500 angstroms and about 20,000 angstroms, as measured along the central axis of the single crystal semiconductor handle wafer.

17. The method of claim 13 wherein the stress layer of silicon oxynitride deposited on the back surface of the single crystal semiconductor handle wafer has a thickness between about 1000 angstroms and about 5000 angstroms, as measured along the central axis of the single crystal semiconductor handle wafer.

18. The method of claim 13 wherein the single crystal semiconductor device layer is between about 40 angstroms and about 1000 angstroms thick, as measured along the central axis of the single crystal semiconductor handle wafer.

19. The method of claim 13 wherein the single crystal semiconductor device layer comprises single crystal silicon.

20. The method of claim 13 wherein the exposed surface of the single crystal semiconductor device layer is smoothed to a root mean square surface roughness over a 30 micrometer by 30 micrometer surface region of less than about 1.5 angstroms.

21. The method of claim 13 wherein the exposed surface of the single crystal semiconductor device layer is smoothed to a root mean square surface roughness over a 30 micrometer by 30 micrometer surface region of less than about 1.0 angstroms.

22. The method of claim 13 wherein the exposed surface of the single crystal semiconductor device layer is smoothed to a root mean square surface roughness over a 30 micrometer by 30 micrometer surface region of between about 0.8 angstroms and about 1.2 angstroms.

23. The method of claim 13 wherein the exposed surface of the single crystal semiconductor device layer is smoothed to a root mean square surface roughness over a 30 micrometer by 30 micrometer surface region of between about 0.8 angstroms and about 1.0 angstroms.

24. The method of claim 13 wherein the exposed surface of the single crystal semiconductor device layer is smoothed by epitaxial smoothing.

* * * * *